United States Patent [19]
Hshieh et al.

[11] Patent Number: 5,731,611
[45] Date of Patent: Mar. 24, 1998

[54] MOSFET TRANSISTOR CELL MANUFACTURED WITH SELECTIVELY IMPLANTED PUNCH THROUGH PREVENT AND THRESHOLD REDUCTOIN ZONES

[75] Inventors: Fwu-Iuan Hshieh, Saratoga; True-Lon Lin, Cupertino, both of Calif.

[73] Assignee: MegaMOS Corporation, San Jose, Calif.

[21] Appl. No.: 593,967

[22] Filed: Jan. 30, 1996

[51] Int. Cl.$^6$ .......................... H01L 27/76; H01L 29/94; H01L 31/062

[52] U.S. Cl. .................. 257/341; 257/344; 257/408

[58] Field of Search .................. 257/336, 344, 257/408, 900, 60, 135, 136, 263, 264, 265, 266, 267, 302, 328, 334, 341, 345; 437/35, 40, 41, 44, 69

[56] References Cited

U.S. PATENT DOCUMENTS 5,554,544  9/1996  Hsu .......................... 437/35

Primary Examiner—Carl W. Whitehead, Jr.
Attorney, Agent, or Firm—Bo-In Lin

[57] ABSTRACT

A n-channel MOSFET device is formed with a selective high energy boron implantation into the N region of the n–channel where a photoresist is employed to cover the central portion over the channel. Small n– regions are formed near the channel source interface. These small n– regions have the advantages of preventing punch through. The selective implant regions have the additional advantages that the JFET resistance is not increased as a result of forming a punch through prevention region near the source channel boundary. Also disclosed in this invention is a p-type DMOS where a novel boron implantation is applied to reduce the threshold voltage. The boron is selectively implanted into the n-type channel near the source, i.e., a threshold sensitive region. The threshold voltage is reduced without unduly lowering the drain to source breakdown voltage.

12 Claims, 10 Drawing Sheets

MOSFET TRANSISTOR CELL MANUFACTURED WITH SELECTIVELY IMPLANTED PUNCH THROUGH PREVENT AND THRESHOLD REDUCTOIN ZONES

BACKGROUND OF THE INVENTION

1. Field of the Invention

This invention relates generally to the structure and fabrication process of planar power MOSFETs. More particularly, this invention relates to a novel and improved structure and process for fabricating a power MOSFET device provided with punch-through prevention and lower threshold voltage.

2. Description of the Prior Art

Conventional structure and processing steps for fabricating a power metal oxide silicon field effect transistor (MOSFET) power device are limited by several technical difficulties. Specifically, conventional planar cellular structure of power MOSFETs, such as square, circular, and hexagonal topologies are limited by the difficulties that 1) the punch-through problems are often more pronounced due to a shorter channel length when the polysilicon space is reduced to achieve higher cell density by shrinking unit cell areas, and 2) threshold voltage is more difficult to adjust due to the concerns of source-to-drain leakage current again caused by the shorter channel length. Additional reduction in the size of the gate electrode also exacerbates the parasitic JFET pinching effect, leading to higher device on-resistance at a small cell pitch. With various electrical and geometric restrictions, the cell density is limited to 6.5 million cells/inch$^2$. For a person of ordinary skill in the art, further increases in planar DMOS cell density is unwarranted and likely to be detrimental to performance. In addition to the JFET pinching effect and other restrictions, the punch-through problems and the difficulty in threshold adjustment, when the channel length is reduced, further compound the technical difficulties in cell size reduction.

In order to better understand the difficulties encountered in the prior art, general descriptions for the techniques currently employed for fabricating power MOSFET devices are first discussed. FIG. 1 shows a typical vertical double diffused MOS (VDMOS) device which uses a double diffusion technique to control the channel length 1. Two successive diffusions are performed with first a p diffusion using boron, then a n diffusion using either arsenic or phosphorus, to produce two closely spaced pn junctions at different depths below the silicon surface. With this pn junction, as shown in FIG. 1, the VDMOS supports the drain voltage vertically in the n$^-$ epilayer. The current flows laterally from the source through the channel, parallel to the surface of the silicon. The current flow then turns through a right angle to flow vertically down through the drain epilayer to the substrate and to the drain contact. The p-type "body" region in which the channel is formed when a sufficient positive voltage is applied, and the n$^+$ source contact regions are diffused successively through the same window etched in the oxide layer. the channel length can be controlled through the processing steps. Because of the relative doping concentrations in the diffused p-channel region and the n– layer, the depletion layer which supports $V_{DS}$, a drain to source voltage, extends down into the epilayer rather than laterally into the channel.

In order to best utilize the silicon, the power MOSFET device is fabricated by employing a cellular structure as that shown in FIGS. 2A and 2B. Several different schemes are used. High current capability is obtained by connecting many cells together in parallel as will be discussed below. As shown in FIG. 2B, heavily doped poly-crystalline silicon is used as gate electrode. For power MOSFETs, it has several advantages because it simplifies the connection metallization process where an oxide layer can be formed over the poly-silicon and the source metallization may then be extended over the whole of the upper surface. The poly silicon, used as gate electrodes, can be deposited with great accuracy and the gate oxide is more stable and less prone to contamination than the aluminum gate. Furthermore, the source is self aligned automatically with the gate edge thus greatly simplifies the fabrication process.

In U.S. Pat. No. 5,248,627 entitled 'Threshold Adjustment in Fabricating Vertical DMOS Devices' (issued on Sep. 28, 1993), Williams discloses a process for fabricating a p-channel VDMOS transistor includes a high temperature long diffusion step subsequent to deposition of the polysilicon gate for forming body regions. The threshold voltage of the VDMOS device is adjusted subsequent to both gate formation and the high temperature long duration of body diffusion by implanting a suitable p-type dopant into the VDMOS channel through the insulated gate after formation of the gate. Since the gate is formed before the threshold adjust, high temperature processing and long duration diffusions requiring the presence of the gate may be completed prior to threshold adjust without risk to the adjusted device threshold.

The process of fabricating a p-channel VDMOS, as disclosed by Williams, still has the problems that blank boron implantation over the whole poly gate may create a shorter channel which will lead to a high leakage current between drain and source. This problem becomes more pronounced when N$^+$ poly gate is used because heavier boron is required to compensate high work function difference between N$^+$ poly and substrate for achieving low threshold voltage.

In a Japanese Patent Application 61-18530, entitled 'Vertical MOS transistor' by Tsuzuki, a vertical MOS transistor is disclosed. In order to prevent punch through between a source and drain Tsuzuki discloses a technique for a n-channel transistor 10 by forming a N$^-$ region 50 above a N type epi-layer 40 supported on a N+ substrate 20 as that shown in FIG. 3. This lightly doped region of a second-conductivity type diffused layer can be used to prevent punch through. However, such layer also causes an undesirable result of increasing the JFET resistance.

Therefore, there is still a need in the art of power device fabrication, particularly for power MOSFET design and fabrication, to provide a structure and fabrication process that would resolve these limitations.

SUMMARY OF THE PRESENT INVENTION

It is therefore an object of the present invention to provide an improved MOSFET structure, and fabrication process to overcome the aforementioned difficulties encountered in the prior art.

Specifically, it is an object of the present invention to provide an improved MOSFET structure and fabrication process wherein a punch-through prevention is provided without unduly increasing the JFET resistance by selectively performing a boron implant into a region near the boundary of the channel and drain regions.

Another object of the present invention is to provide an improved MOSFET structure and fabrication process wherein the threshold voltage is reduced by patterned boron implantation through a photo resist masked poly gate where the boron is selectively implanted into the n-type body channel region near the source thus the difficulty of source-to-drain leakage current can be prevented even with short channel length.

Briefly, in a preferred embodiment, the present invention discloses a MOSFET device formed in a semiconductor chip with a top surface and a bottom surface. The device includes a drain region, doped with impurities of a first conductivity type, formed in the semiconductor chip near the bottom surface. The MOSFET device further includes a vertical pn-junction region includes a lower-outer body region, doped with impurities of a second conductivity type, formed on top of the drain region. The pn-junction region further includes a source region, doped with impurities of the first conductivity type, formed on top of the lower-outer body region wherein the lower-outer body region forming a channel region extending from the source region to the drain region near the top surface. The MOSFET device further includes a gate formed above the channel region on the top surface, the gate includes a thin insulative bottom layer for insulating from the channel region, the gate is provided for applying a voltage thereon for controlling a current flowing from the source region to the drain region via the channel region. The MOSFET device further includes a punch-through prevention zone near the top surface close to a boundary between the lower-outer body region and the channel wherein the punch-through prevention zone is selectively implanted with a lower concentration of impurities of the first conductivity type whereby a punch-through for the device is prevented without increasing a JFET resistance of the device.

These and other objects and advantages of the present invention will no doubt become obvious to those of ordinary skill in the art after having read the following detailed description of the preferred embodiment which is illustrated in the various drawing figures.

DETAILED DESCRIPTION OF THE PREFERRED EMBODIMENT

Figure 1:
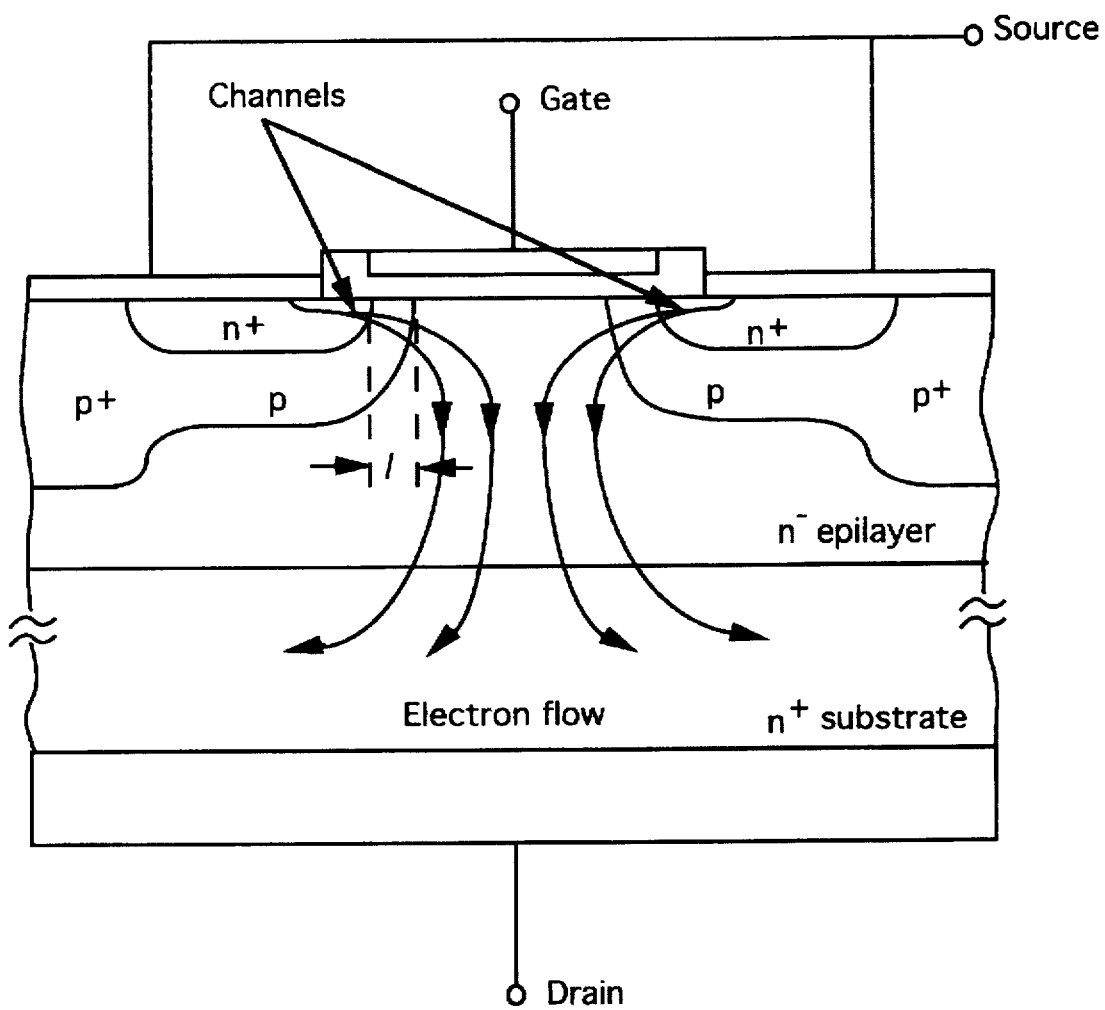
FIG. 1 is a cross-sectional view of a prior art structure of a general MOSFET.
Figure 2A:
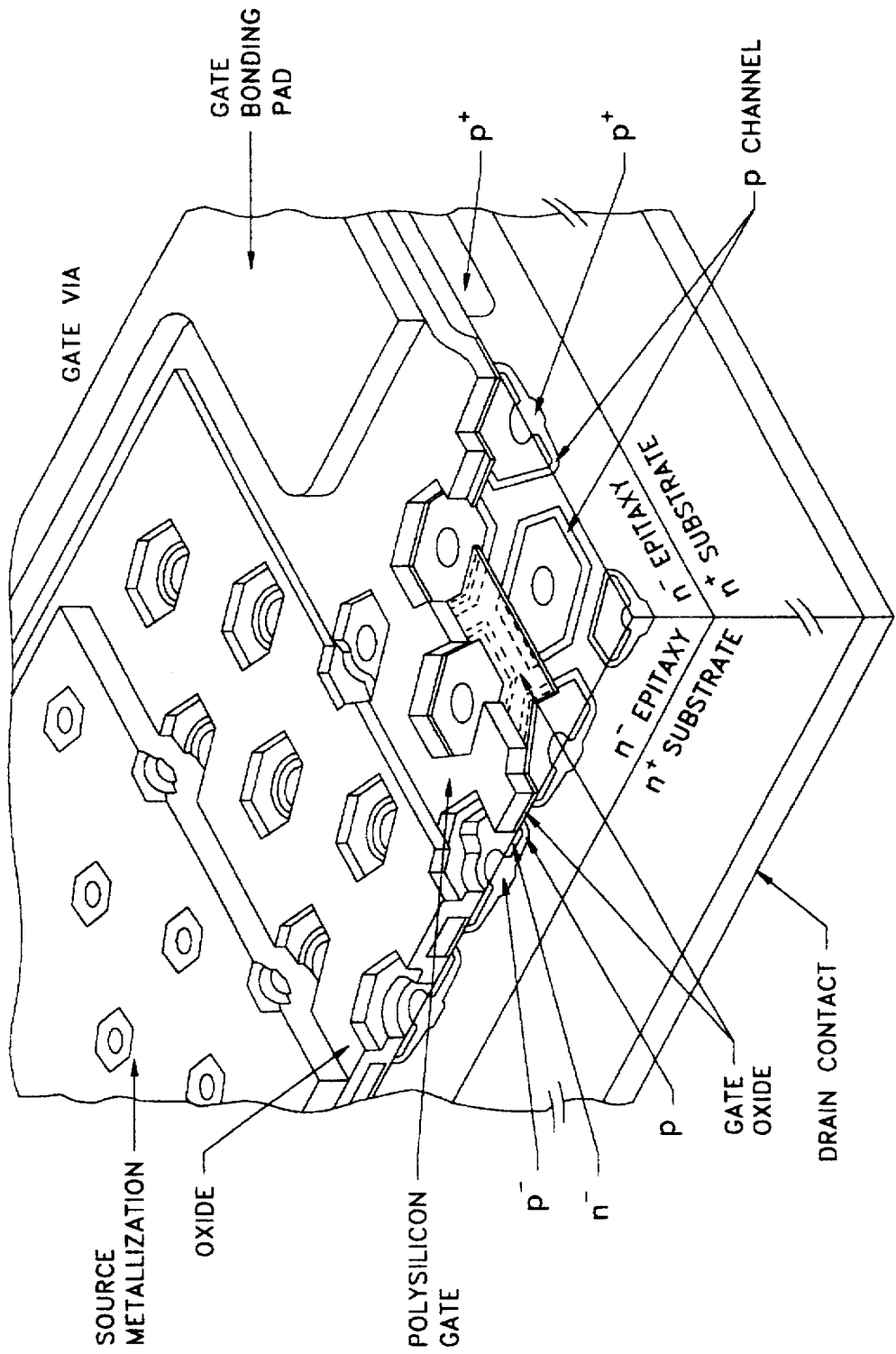
FIGS. 2A to 2B are partial perspective views of the layer structure of a prior art hexagonal and square MOSFET respectively.
Figure 2B:
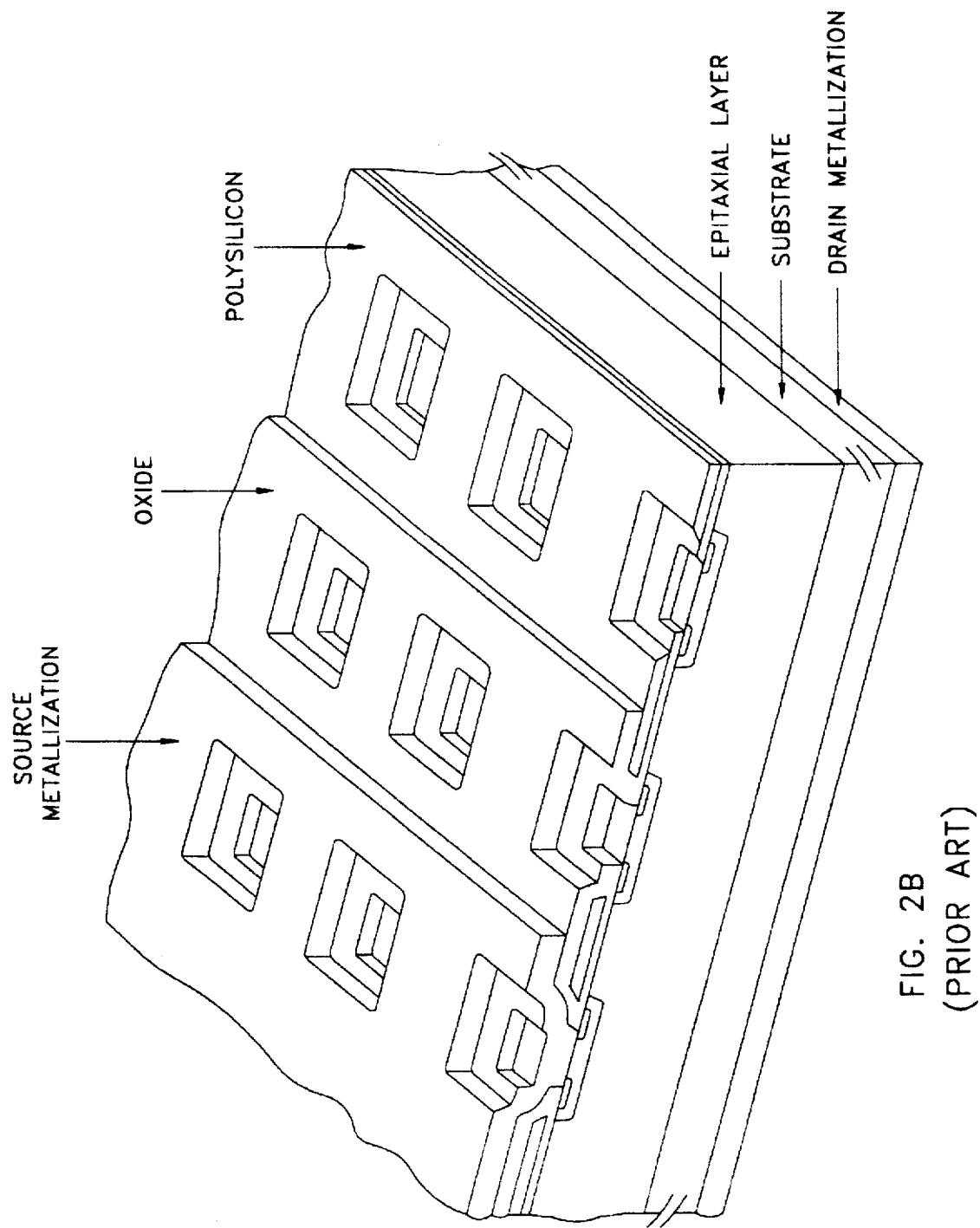
Figure 3:
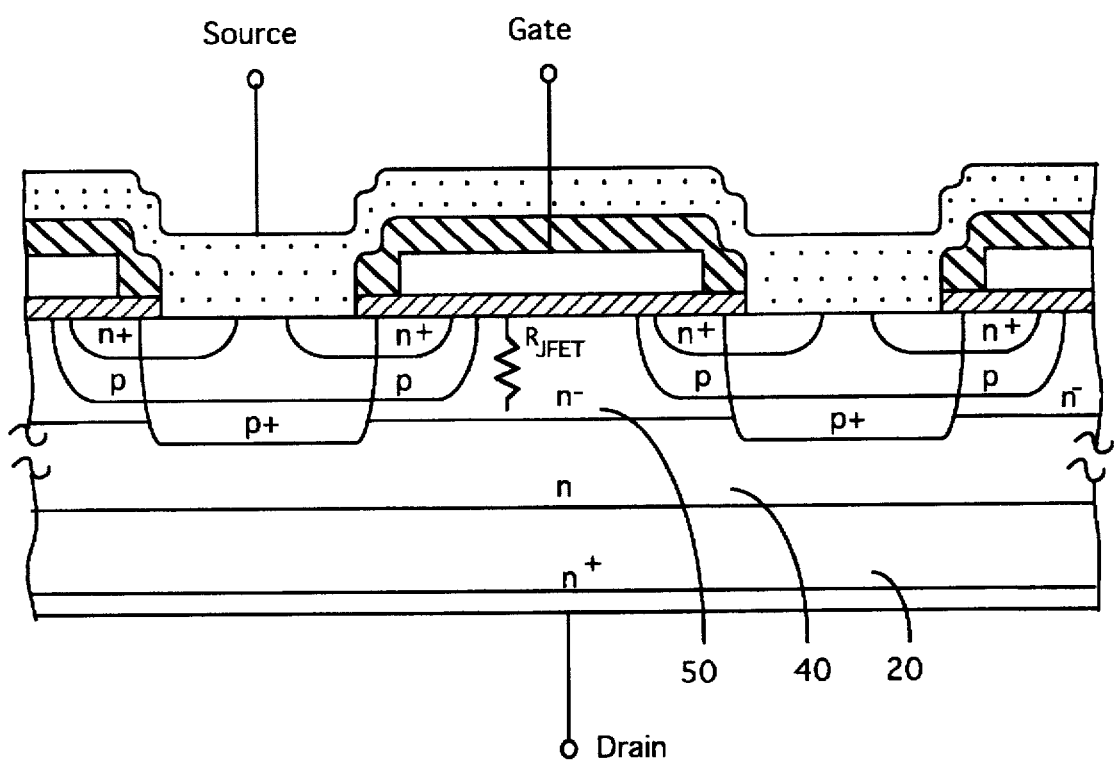
FIG. 3 is a cross-sectional view of MOSFET cell of a prior art cell with a punch-through prevention structure.
Figure 4A:
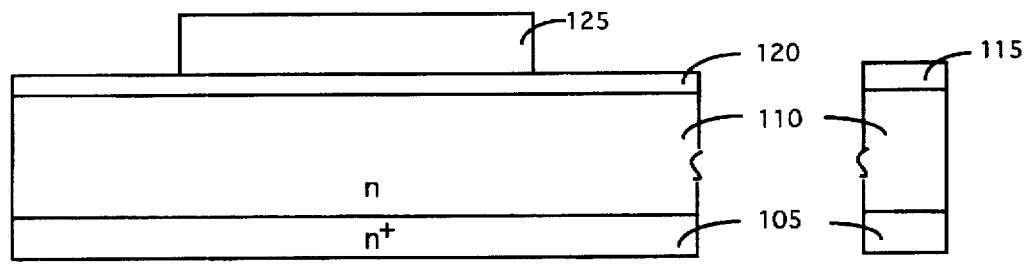
FIGS. 4A to 4D show the processing steps for manufacturing a MOSFET device according to the present invention with a selective high energy boron implantation near the boundary of the p-body and the channel.

The processing steps for manufacturing a punch-through-prevention power MOSFET device of the present invention are illustrated in FIGS. 4A to 4D. As shown in FIG. 4A, the processing steps begins by first growing a N epitaxial layer 110 with a resistivity ranging from 0.1 to 1.0 ohm-cm on top of a $N^+$ substrate 105. The substrate has a resistivity of 0.001 to 0.007 ohm-cm. The thickness and the resistivity of the epitaxial layer 110 depend on the device requirements for the on-resistance and breakdown voltage. In a preferred embodiment, the thickness of the epi-layer 110 is about six to eight microns (6–8 μm). An initial oxide layer 115 of thickness in the range of 5,000 to 10,000 Å is grown which is then etched by applying a mask to define the active areas. A gate oxidation process is first carried out to form a gate oxide layer 120. A polysilicon layer 125 is then deposited on the gate oxide layer 120. A $POCL_3$ doping process is carried out followed by an As-implant process with an ion beam of energy at 60–80 Kev with a flux density of 5 to $8\times10^{15}/cm^2$. A poly mask is then applied to carry out the an anisotropic etching process to define the poly gate 125.

Figure 4B:
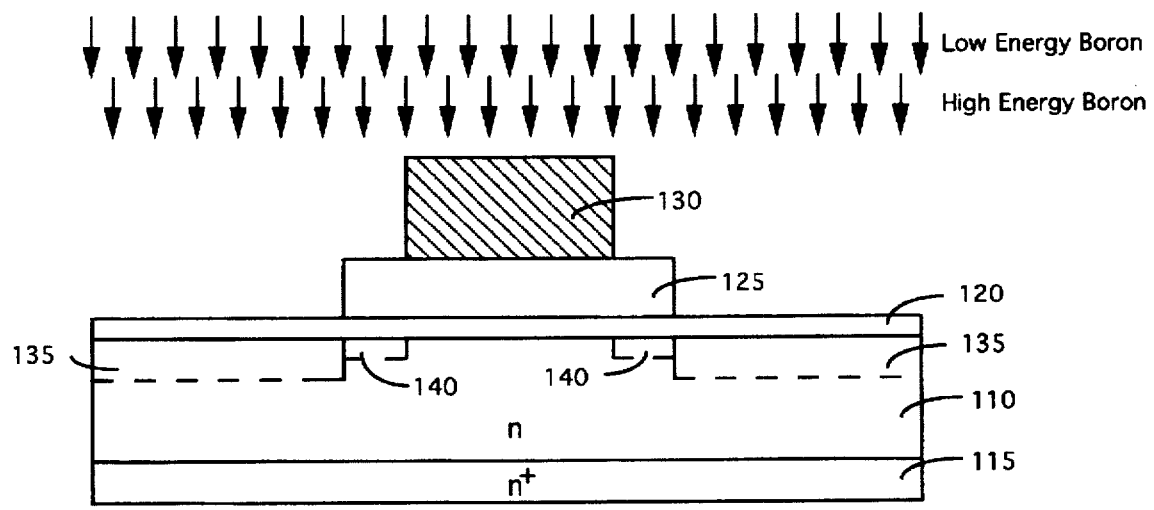

Referring to FIG. 4B where the resist is stripped and a p-body mask 130 is applied to perform a p-body implant at 30–100 Kev with an ion beam of $3\times10^{13}$ to $3\times10^{14}/cm^2$ flux density to form the p-body region 135. A high energy punch-through prevention implant with boron ion beam is then carried out at approximately 300 Kev with flux density ranging from $10^{11}$ to $5\times10^{12}/cm^2$ to form the $N^-$ regions 140. A p-body diffusion process is then carried out at an elevated temperature of 1,000°–1,200° C. for ten minutes to three hours to increase the depth of the p-body region 135 to 1.0–2.0μ.

Figure 4C:
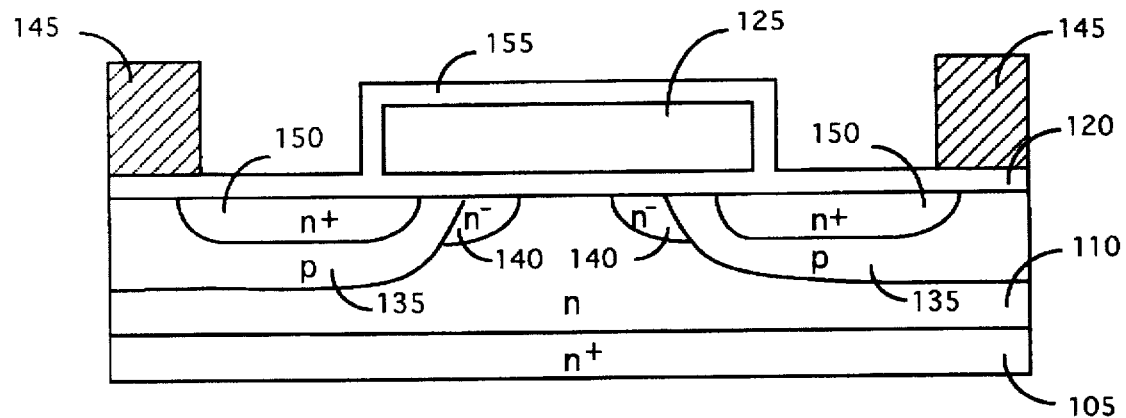
Figure 4D:
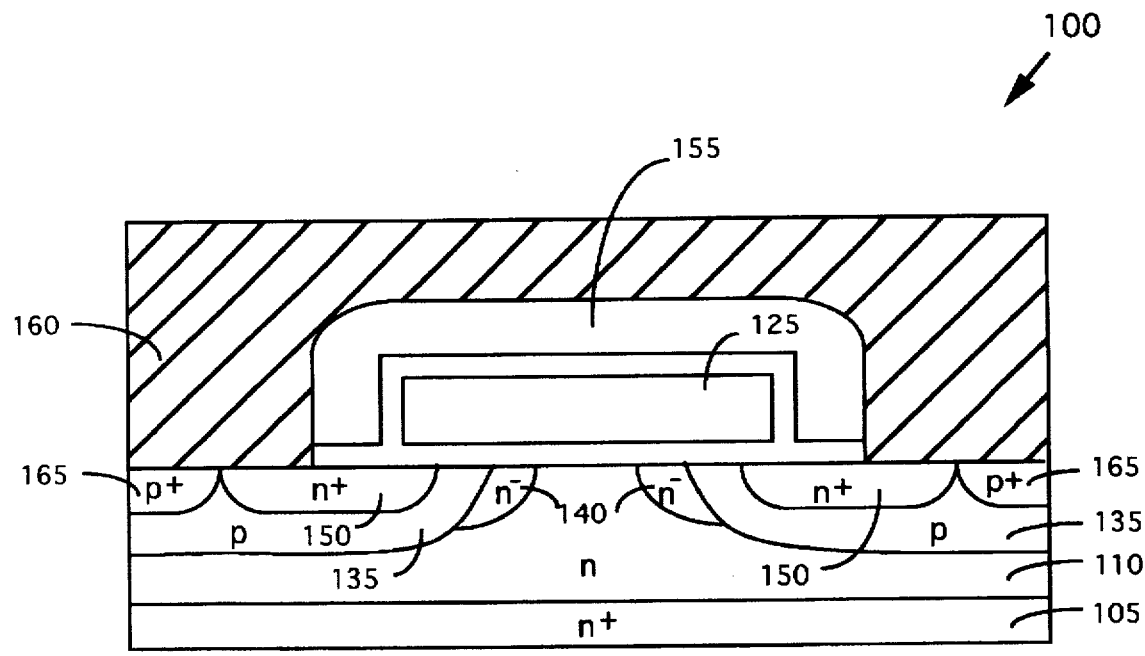

Referring to FIG. 4C, a N+ block mask 145 is applied to carry out an N+ implant to form the N+ region 150. The $N^+$ implantation is carried out with an ion beam at an energy of 60–100 Kev and ion flux density of $5\times10^{15}$ to $1\times10^{16}/cm^2$. After the resist, i.e., the $N^+$ blocking mask, is stripped, the $N^+$ source regions 150 are driven into desired junction depth ranging from 0.2 to 1.0μ by a diffusion process. Referring to FIG. 4D, a BPSG or PSG is deposited to form a layer 155 of approximately 5000–15,000 Å in thickness. A BPSG flow or PSG densification process is performed at 900°–950° C. for thirty minutes to one hour. A contact mask is applied to perform an etching process to define the contacts 160. A p+ ion implantation is carried out, with boron at 30–60 Kev having an flux density of $10^{15}$ to $2\times10^{15}/cm^2$, to form the p+ region 165 by a p+ activation process at 900°–950° C. in an oxidation or inert gas ambient. The final power MOSFET device 100 is completed with the metal deposition and metal etching with a metal mask to define the source contact, the gate contacts, the field plate and equal potential ring (EQR) and since these metal contacts are well known in the art and since they are not the major features of the invention, these metal contacts are not shown for sake of simplicity.

Figure 5:
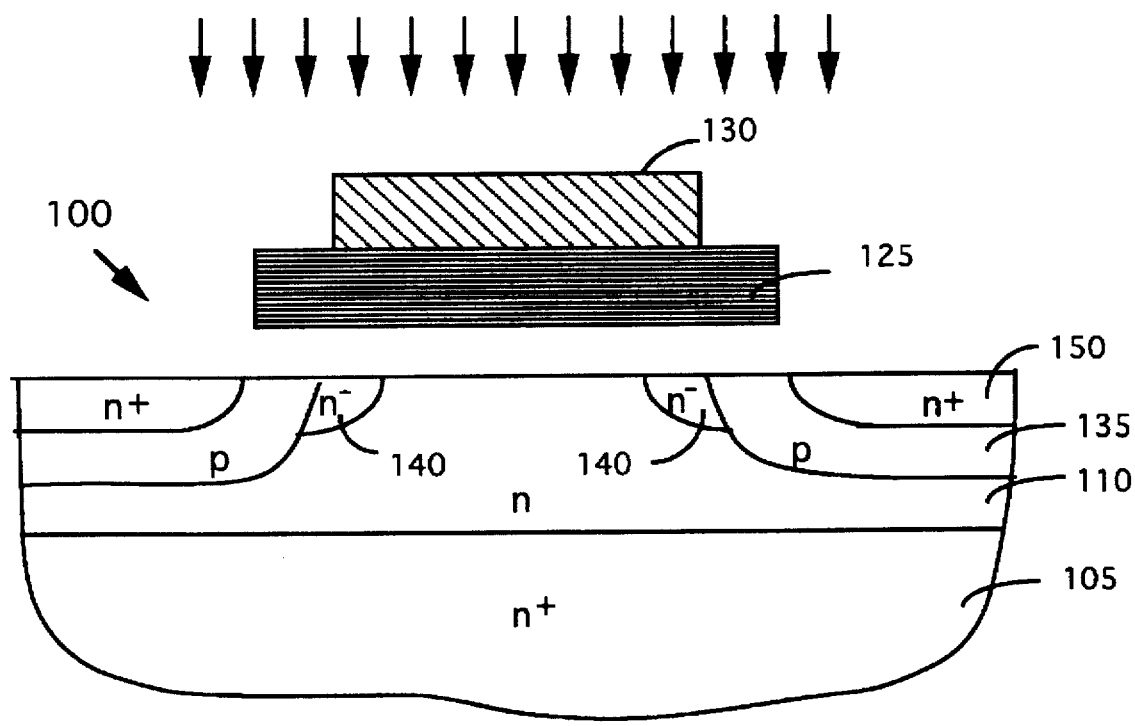
FIG. 5 is a cross-sectional view of a MOSFET device with a selective patterned implantation in the drain region manufactured by the processing steps of FIGS. 4A to 4D.

Please refer to FIG. 5, where a cross-sectional view of the n-channel MOSFET device manufactured by the above processing steps is shown. A selective high energy boron implantation into the channel region is performed, with a photo-resist 130 covers the central portion of the gate, to form small $N^-$ regions 140 near the drain-channel interface. This small $N^-$ region 140 has the benefit of preventing punch through. Unlike the MOS transistor as disclosed by Tsuzuk in the Japanese Patent Application, the $N^-$ region is not formed over the entire channel region. This selective $N^-$ region 140 in preventing punch through provides additional advantage over the Japanese prior art that the JFET resistance is not increased as a result of forming a punch-through-prevention region 140 near the source-channel boundary.

In summary, the present invention discloses a MOSFET device 100 formed in a semiconductor chip 105 with a top surface and a bottom surface. The device 100 includes a drain region 110, doped with impurities of a first conductivity type, formed in the semiconductor chip near the bottom surface. The MOSFET device further includes a vertical pn-junction region includes a lower-outer body region 135, doped with impurities of a second conductivity type, formed on top of the drain region 110. The pn-junction region further includes a source region 150, doped with impurities of the first conductivity type, formed on top of the lower-outer body region 135 wherein the lower-outer body region 135 forming a channel region extending from the source region 150 to the drain region 110 near the top surface. The MOSFET device includes a gate 125 formed on top of the channel region on the top surface, the gate 125 includes a thin insulative bottom layer 120 for insulating from the channel region. The gate 125 is provided for applying a voltage thereon for controlling a current flowing from the source region 150 to the drain region 110 via the channel region. The MOSFET device further includes a punch-through prevention zone 140 near the top surface close to a boundary between the lower-outer body region 135 and the channel wherein the punch-through prevention zone is selectively implanted in the drain region 110 with a lower concentration of impurities of the second conductivity type whereby a punch-through for the device 100 is prevented without increasing a JFET resistance of the device 100.

Figure 6A:
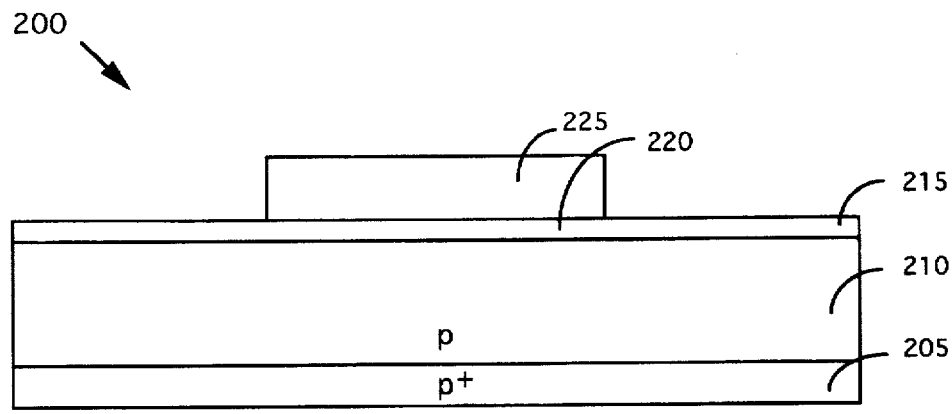
FIGS. 6A to 6D show the processing steps for manufacturing a MOSFET device according to the present invention with a selective high energy boron implantation near the boundary of the p-body and the channel.

The processing steps for manufacturing the improved p-channel power MOSFET device 200 with low threshold voltage according to the present invention are illustrated in FIGS. 6A to 6D. As shown in FIG. 6A, the processing steps begins by first growing a P⁻ epitaxial layer 210 with a resistivity ranging from 0.1 to 2.0 ohm-cm on top of a P⁺ substrate 205. The substrate has a resistivity of 0.001 to 0.02 ohm-cm. The thickness and the resistivity of the epitaxial layer 210 depend on the device requirements for the on-resistance and breakdown voltage. In a preferred embodiment, the thickness of the epi-layer 210 is about six to eight microns (6–15 μm). An initial oxide layer 215 of thickness in the range of 5,000 to 10,000 Å is grown which is then etched by applying an mask to define the active areas. A gate oxidation process is first carried out to form a gate oxide layer 220. A polysilicon layer 225 is then deposited on the gate oxide layer 220. For N⁺ doped poly, a POCL₃ doping process is carried out followed by an As-implant process with an ion beam of energy at 60–80 Kev with a flux density of 5 to $8\times10^{15}$/cm². A poly mask is then applied to carry out the an anisotropic etching process to define the poly gate 225. For a P⁺ poly, the poly gate is doped with a boron source implant process.

Figure 6B:
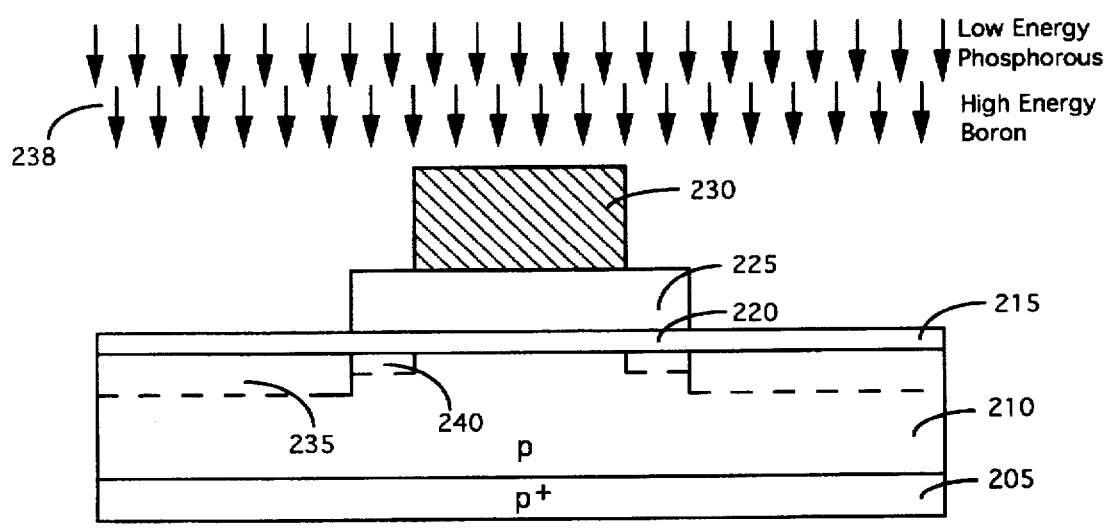

Referring to FIG. 6B where the resist is stripped and a n-body mask 230 is applied to perform a p-body implant at 30–100 Kev with an ion beam of $3\times10^{13}$ to $3\times10^{14}$/cm² flux density to form the n-body region 235. A high energy threshold voltage adjustment is carried out with boron ions 238 at approximately 300 Kev with an ion beam of $10^{11}$ to $2\times10^{13}$/cm² flux density carried out to form a regions 240 where the doping concentration is higher than the epitaxial layer 210. A n-body diffusion process is then carried out at an elevated temperature of 1,000°–1,200° C. for ten minutes to increase the depth of the n-body region 235 to 1.0–2.0μ.

Figure 6C:
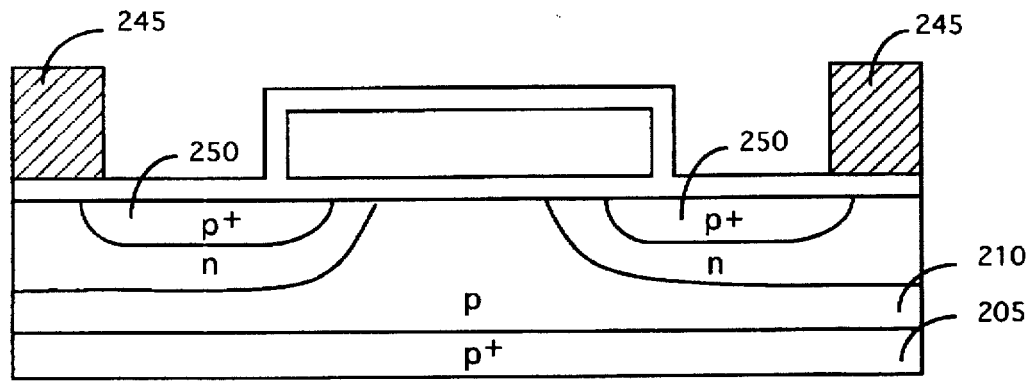
Figure 6D:
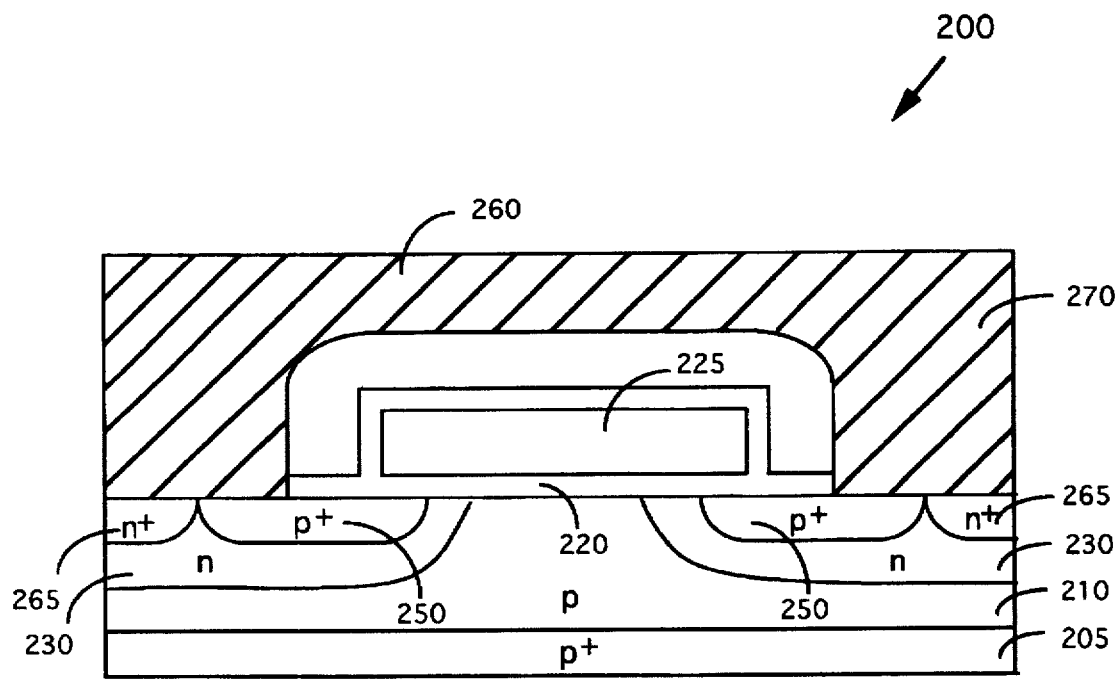

Referring to FIG. 6C, a p+ block mask 245 is applied to carry out a p⁺ implant to form the p⁺ region 250. The p⁺ implantation is carried out with an ion beam at an energy of 60–100 Kev and ion flux density of $5\times10^{15}$ to $1\times10^{16}$/cm². After the resist is stripped, the p⁺ source regions 250 are driven into desired junction depth ranging from 0.2 to 1.0μ by a diffusion process. Referring to FIG. 6D, a BPSG or PSG is deposited to form a layer 260 of approximately 5000–15,000 Å in thickness. A BPSG flow or PSG densification process is performed at 900°–950° C. for thirty minutes to one hour. A contact mask is applied to perform an etching process to define the contacts 270. A n+ ion implantation is carried out with an As-implant process with an ion beam of energy at 60–150 Kev with a flux density of $10^{15}$ to $2\times10^{15}$/cm², to form the n+ region 265 by a n+ activation process at 900°–950° C. in an oxidation or inert gas ambient. The final power MOSFET device 200 is completed with the metal deposition and metal etching with a metal mask to define the source contact, the gate contacts, the field plate and equal potential ring (EQR), and again for the sake of simplicity, these metal contacts are not shown since they are well known in the art.

Figure 7A:
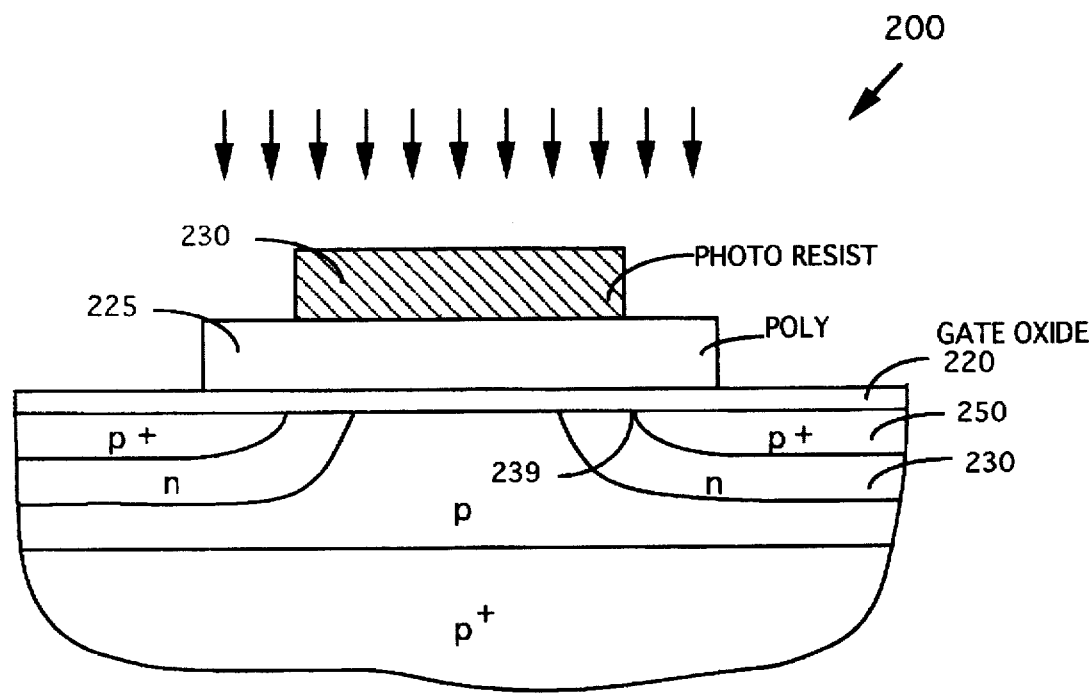
FIG. 7A shows the cross-sectional view of a MOSFET device manufactured by the processing steps of FIGS. 7A to 7D for a lower threshold voltage while preventing source-to-drain leakage current.

Please refer to FIG. 7A for a cross sectional view of the p-type DMOS 200 where a novel boron implantation technique is shown to reduce the threshold voltage. By arranging the photo-resist 230 over the poly 225 such that the boron is selectively implanted into the n-type channel near the source, i.e., a region 239, which is a threshold voltage sensitive region. By selectively implanting the region 239, the threshold voltage can be effectively reduced without unduly lowering the drain to source breakdown voltage BVds.

Figure 7B:
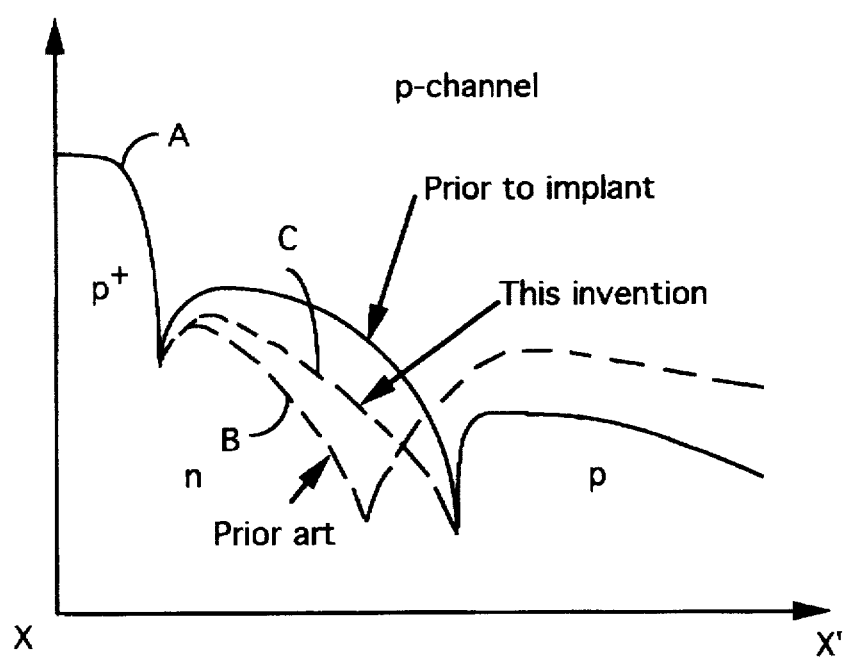
FIG. 7B shows the doping profile of over the length from the source to the channel for the prior art and that of the present invention.

This method and structure can be applied to either N⁺ or P⁺ doped poly gate. The N⁺ doped poly gate is generally preferred because it provides higher switching speed. FIG. 7B shows a dopant concentration profile over the length of X-X'. Curve A shows the dopant concentration prior to implantation. Curve B shows the profile resulting from conventional implantation techniques while curve C shows a profile when implantation is carried out by the technique of the present invention according to a photo-resist mask shown in FIG. 7A. The problem of the prior art of a lower breakdown voltage due to early punch through as the result of the reduction n-type doping concentration near the drain region (see Curve B in FIG. 7B) and channel length is eliminated. By the use of this patterned boron implantation, the threshold voltage is reduced without comprising the breakdown voltage.

Thus, the present invention further discloses a MOSFET device 200 formed in a semiconductor chip 205 with a top surface and a bottom surface. The device 200 includes a drain region 210, doped with impurities of a first conductivity type, formed in the semiconductor chip 205 near the bottom surface. The MOSFET device 200 further includes a vertical pn-junction region includes a lower-outer body region 235, doped with impurities of a second conductivity type, formed on top of the drain region 210. The pn-junction region further includes a source region 250, doped with impurities of the first conductivity type, formed on top of the lower-outer body region 235 wherein the lower-outer body region 235 forming a channel region extending from the source region 250 to the drain region 210 near the top surface. The MOSFET device 200 further includes a gate 225 formed on top of the channel region on the top surface, the gate 225 includes a thin insulative bottom layer 220 for insulating from the channel region. The gate 225 is provided for applying a voltage thereon for controlling a current flowing from the source region 250 to the drain region 205 via the channel region. The MOSFET device 200 further includes a threshold reduction zone 240 near the top surface close to a boundary between the source region 250 and the lower-outer body region 235 wherein the threshold reduction zone 240 is selectively implanted with impurities of a conductivity type same as that of the source region 250 whereby a threshold voltage for the device 200 is reduced.

Therefore, improved MOSFET structures, and fabrication processes are provided in the present invention to overcome the difficulties encountered in the prior art. Specifically, an improved MOSFET structure and fabrication process are provided wherein a punch-through prevention is selectively implanted with a high energy boron beam into a region near the boundary of the channel and drain regions without unduly increasing the JFET resistance. Furthermore, another improved MOSFET structure and fabrication process are provided wherein the threshold voltage is reduced by patterned boron implantation through a photo resist masked poly gate where the boron is selectively implanted into the n-type body channel near the source thus the difficulty of source-to-drain leakage current can be eliminated even with short channel length.

Although the present invention has been described in terms of the presently preferred embodiment, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

We claim:

1. A vertical MOSFET cell formed in a semiconductor chip with a top surface and a bottom surface, said cell comprising:

a drain region, doped with impurities of a first conductivity type, formed in said semiconductor chip at said bottom surface;

a lower-outer body region, doped with impurities of a second conductivity type, disposed above said drain region;

a source region, doped with impurities of said first conductivity type, formed on top of and surrounded by said lower-outer body region wherein said lower-outer body region providing a vertical channel extending in substantially a vertical direction from said source region via said lower outer body to said drain region near said bottom surface;

a gate formed on said top surface above said vertical channel thus covering a portion of said lower outer body region and said source region, said gate includes a thin insulative bottom layer for insulating from said channel region, said gate is provided for applying a voltage thereon for controlling a current flowing from said source region to said drain region via said channel extended through said lower outer body region; and a punch-through prevention zone near said top surface extended laterally away from said lower-outer body region to said drain region under said gate wherein said punch-through prevention zone is selectively implanted through said gate with impurities of said second conductivity type whereby a punch-through for said device is prevented without increasing a JFET resistance of said device.

2. The vertical MOSFET cell as recited in claim 1 wherein:

said impurities of said first conductivity-type is a n-type conductivity for making a n-channel vertical MOSFET cell.

3. The vertical MOSFET cell as recited in claim 2 wherein:

said punch-through prevention zone is selectively implanted with boron ions.

4. The vertical MOSFET cell as recited in claim 3 wherein:

said punch-through prevention is a $N^-$ zone selectively implanted with high energy boron ions at an energy of approximately 300 Kev.

5. The vertical MOSFET cell as recited in claim 1 further comprising:

a source contact formed on said top surface in electric contact with said source region.

6. The vertical MOSFET cell as recited in claim 1 further comprising:

a threshold reduction zone near said top surface close to said channel and said source region in said lower-outer body region wherein said threshold reduction zone is selectively implanted with impurities of a conductivity type same as said source region for reducing a body-doping concentration of said channel near said source region whereby a threshold voltage for said MOSFET cell is reduced.

7. A vertical MOSFET cell formed in a semiconductor chip with a top surface and a bottom surface, said cell comprising:

a drain region, doped with impurities of a first conductivity type, formed in said semiconductor chip near said bottom surface;

a lower-outer body region, doped with impurities of a second conductivity type, disposed above said drain region;

a source region, doped with impurities of said first conductivity type, formed on top of and surrounded by said lower-outer body region wherein said lower-outer body region providing a vertical channel extending in substantially a vertical direction from said source region via said lower outer body to said drain region near said bottom surface;

a gate formed on said top surface above said vertical channel thus covering a portion of said lower outer body region and said source region, said gate includes a thin insulative bottom layer for insulating from said channel region, said gate is provided for applying a voltage thereon for controlling a current flowing from said source region to said drain region via said channel extended through said lower outer body region; and a threshold reduction zone near said top surface close to said channel and said source region in said lower-outer body region wherein said threshold reduction zone is selectively implanted with impurities of a conductivity type same as said source region for reducing a body-doping concentration of said channel near said source region whereby a threshold voltage for said MOSFET cell is reduced.

8. The vertical MOSFET cell as recited in claim 7 wherein:

said impurities of said first conductivity-type is a p-type conductivity for making a p-channel MOSFET cell.

9. The vertical MOSFET cell as recited in claim 8 wherein:

said threshold reduction zone is selectively implanted with boron ions.

10. The vertical MOSFET cell as recited in claim 9 wherein:

said threshold reduction zone is selectively implanted with high energy boron ions at an energy of approximately 300 Kev.

11. The vertical MOSFET cell as recited in claim 7 further comprising:
   a source contact formed on said top surface in electric contact with said source region.

12. The vertical MOSFET cell as recited in claim 7 further comprising:
   a punch-through prevention zone near said top surface extended laterally away from said lower-outer body region to said drain region under said gate wherein said punch-through prevention zone is selectively implanted through said gate with impurities of said second conductivity type whereby a punch-through for said device is prevented without increasing a JFET resistance of said device.

* * * * *